US006859095B2

United States Patent
Nandy et al.

(10) Patent No.: US 6,859,095 B2
(45) Date of Patent: Feb. 22, 2005

(54) NON-SWITCHED CAPACITOR OFFSET VOLTAGE COMPENSATION IN OPERATIONAL AMPLIFIERS

(75) Inventors: Tapas Nandy, Delhi (IN); Kirtiman Singh Rathore, H.P. (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/356,650

(22) Filed: Jan. 31, 2003

(65) Prior Publication Data

US 2003/0214351 A1 Nov. 20, 2003

(30) Foreign Application Priority Data

Jan. 31, 2002 (IN) ........................................ 81/DEL/2002

(51) Int. Cl.[7] ................................................ H03F 1/02
(52) U.S. Cl. ........................... 330/9; 330/253; 327/124
(58) Field of Search ........................ 330/9, 252, 253, 330/257, 258, 261; 327/124

(56) References Cited

U.S. PATENT DOCUMENTS

| 4,356,450 | A |   | 10/1982 | Masuda .......................... 330/9 |
| 4,933,643 | A |   | 6/1990  | Jandu et al. .................... 330/9 |
| 6,137,362 | A | * | 10/2000 | Dufossez ..................... 330/254 |
| 6,140,872 | A | * | 10/2000 | McEldowney ................. 330/9 |
| 6,262,625 | B1 |  | 7/2001  | Perner et al. ................... 330/2 |
| 6,661,288 | B2 | * | 12/2003 | Morgan et al. ............. 330/258 |

* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A method for reducing offset voltage in an operational amplifier without the need for switched-capacitors, includes introducing a tapped resistor chain between the common connected terminals of the transistors of the input differential pair of the operational amplifier and connecting the tail current source/sink of the differential amplifier to a selected tap of the resistor chain. The invention further provides an improved operational amplifier in accordance with the above method.

8 Claims, 3 Drawing Sheets

NON-SWITCHED CAPACITOR OFFSET VOLTAGE COMPENSATION IN OPERATIONAL AMPLIFIERS

FIELD OF THE INVENTION

The present invention relates to non-switched capacitor offset voltage compensation in operational amplifiers, and is suitable for digital processes where the analog characteristics of the process are not defined.

BACKGROUND OF THE INVENTION

Operational amplifiers (opamps) are very widely used analog components. Their versatility makes them a building block for several applications. Typically, opamps exhibit certain limitations, the most important of which is the offset voltage. The offset voltage of an opamp is the differential voltage required to be applied at the input of the opamp to produce a null output. Many applications require the cancellation/minimization of the offset voltage.

There are a few well-known approaches to reduce/cancel the input referred offset or the effect of input referred offset in the opamps. If the opamp is used in the switched capacitor circuit, then offset voltage is stored in the capacitors connected to the input of the opamp during one phase of operation as discussed in "Analog MOS. Integrated Circuits for Signal Processing" by Rubik Gregorian and Gabor C. Temes. This is an effective technique, although it cannot be used in non-switched capacitor circuits.

There is a technique used in discrete opamp ICs, where an external potentiometer is used to nullify the offset voltage; but this technique needs two more pins, which is not an attractive approach when an opamp is just a part of a big chip with limited pin-outs. The third technique involves the input differential pair, the load transistors and current mirrors being sized and laid out in a matching fashion. The final offset voltage is determined by the difference in threshold voltages of the input differential pair and the active load devices, the gate area mismatch of the input differential and load devices, and the mismatch in the effective gate-source voltage of the input differential pair as discussed in "Analysis and design of Analog Integrated Circuits" by Paul R. Gray and Robert G. Meyer. The random mismatch in the currents in the gain and the load devices of the second stage of a two-stage opamp would further add up to the offset voltage.

To accurately determine and guarantee the offset voltage during design phase, it is necessary to know the precise analog characterization of the process which determines the mismatch of the parameters against different gate area, gate voltage, drain current, distance between the components in the layout etc. Unfortunately, pure digital CMOS processes do not characterize these values. Most ICs today are manufactured with large digital sections and some analog functionality. For economic viability, most of these chips are targeted on cheap CMOS digital processes. As an integral building block of analog circuitry, the demand for accurate opamps, which are not used in the switched capacitor circuits, is on the rise. Therefore, there is a need to develop a technique to produce opamps with input offset voltage guaranteed within a limit.

EP 1104092/U.S. Pat. No. 6,262,625 describes a method for reducing offset voltage by adjusting the body-bias ($V_B$) of input pair MOS and transconductance ($g_m$) of the load pair by DAC (digital to analog converter). Nwell only CMOS process cannot provide separate $V_B$ control of the NMOS input pair. So only the PMOS input pair OPAMP is possible, or else a costly process option (e.g. isolated PWELL) would be needed. Separate DAC requires extra constant consumption.

U.S. Pat. No. 4,356,450 defines a technique for eliminating offset voltage by adding Offset voltage/current to one of the input terminals by DAC/DAC+Voltage-to-current-converter (V2I). A separate DAC, extra comparator and opamp (for V2I) are needed, and it suffers from consumption and area overhead. Also, U.S. Pat. No. 4,933,643 proposes a method where the offset is cancelled by introducing a current imbalance at the input level shifter or the cascoded loads. It starts by introducing a deliberate offset in one direction and cancels that one; and, for any mismatch, if the offset is in the other direction it cannot be cancelled. This method also suffers from constant consumption in the current divider, which does not contribute to the opamp.

SUMMARY OF THE INVENTION

An object of this invention is to overcome the above-mentioned drawbacks and to provide a method and apparatus for reducing the input offset voltage of an operational amplifier without the need for switched capacitors, an external offset correction potentiometer, precise matching between internal components or analog characterizations of the fabrication process.

To achieve the objective, this invention provides a method for reducing offset voltage in an operational amplifier without the need for switched-capacitors, external offset-correction resistors, precise matching between the internal components of the operational amplifier or analog characterization of the fabrication process. The method does not result in any increase in the static current consumption of the operational amplifier. The method includes: introducing a tapped resistor chain between the common connected terminals of the transistors of the input differential pair of the operational amplifier and connecting the tail current source/sink of the differential amplifier to a selected tap of the resistor chain; operating, periodically or whenever desired, the operational amplifier in a calibration mode when the input terminals of the input differential amplifier are disconnected from the input terminals of the operational amplifier and connected to the same common-mode internal reference voltage point; monitoring the final output voltage and adjusting the selection of the tap in the resister chain to which the tail current source/sink is connected in the input differential amplifier to minimize the value of the final offset voltage; and storing the final tap selection and reconnecting the input differential amplifier inputs to the operational amplifier input terminals for resuming normal operation.

The calibration mode includes disconnecting the internal phase compensation circuitry, if any, and operating the operational amplifier in open loop mode, as a comparator to provide minimum delay. The selection of the tap in the resistor chain during the calibration mode is automatically performed using any known successive approximation technique. The above method includes the use of a single resistor strip with side contacts for the taps, to minimize inaccuracies due to finite contact resistances.

The present invention further provides an improved operational amplifier providing reduced offset voltage without the need for switched-capacitor circuitry, external offset adjustment resistors, tightly matched internal components, or a fabrication process characterized for analog parameter. The operational amplifier does not consume any additional static current, and includes: an input differential amplifier incorporating a tapped resistor chain connected between the common-connected terminals of the transistors of the input differential amplifier with the current source/sink output connected to a selected one of the taps; a mechanism for operating the operational amplifier in a calibration mode either periodically or whenever desired; means/unit for disconnecting the inputs of the input differential amplifier from the inputs of the operational amplifier, and connecting them to the same common-mode internal reference voltage, during the calibration mode; means/unit for monitoring the output voltage and adjusting the selection of the tap in the resistor chain such that the offset voltage is minimized; and a mechanism for storing the selection of the resistor tap and reconnecting the inputs of the input differential amplifier to the input terminals of the operational amplifier, for resuming normal operation.

The means/unit for disconnecting phase compensation circuitry, if any, and operating the operational amplifier as a comparator during the calibration mode are provided, so as to minimize delay. The mechanism for automatically determining tap selection in the resistor chain is any known successive approximation technique. The tapped resistor chain is made using a single resistor strip with side taps, so as to minimize inaccuracies due to finite contact resistances.

BRIEF DESCRIPTION OF THE DRAWINGS

The invention will be described with reference to the accompanying drawings.

DETAILED DESCRIPTION OF THE PREFERRED EMBODIMENTS

Figure 1:
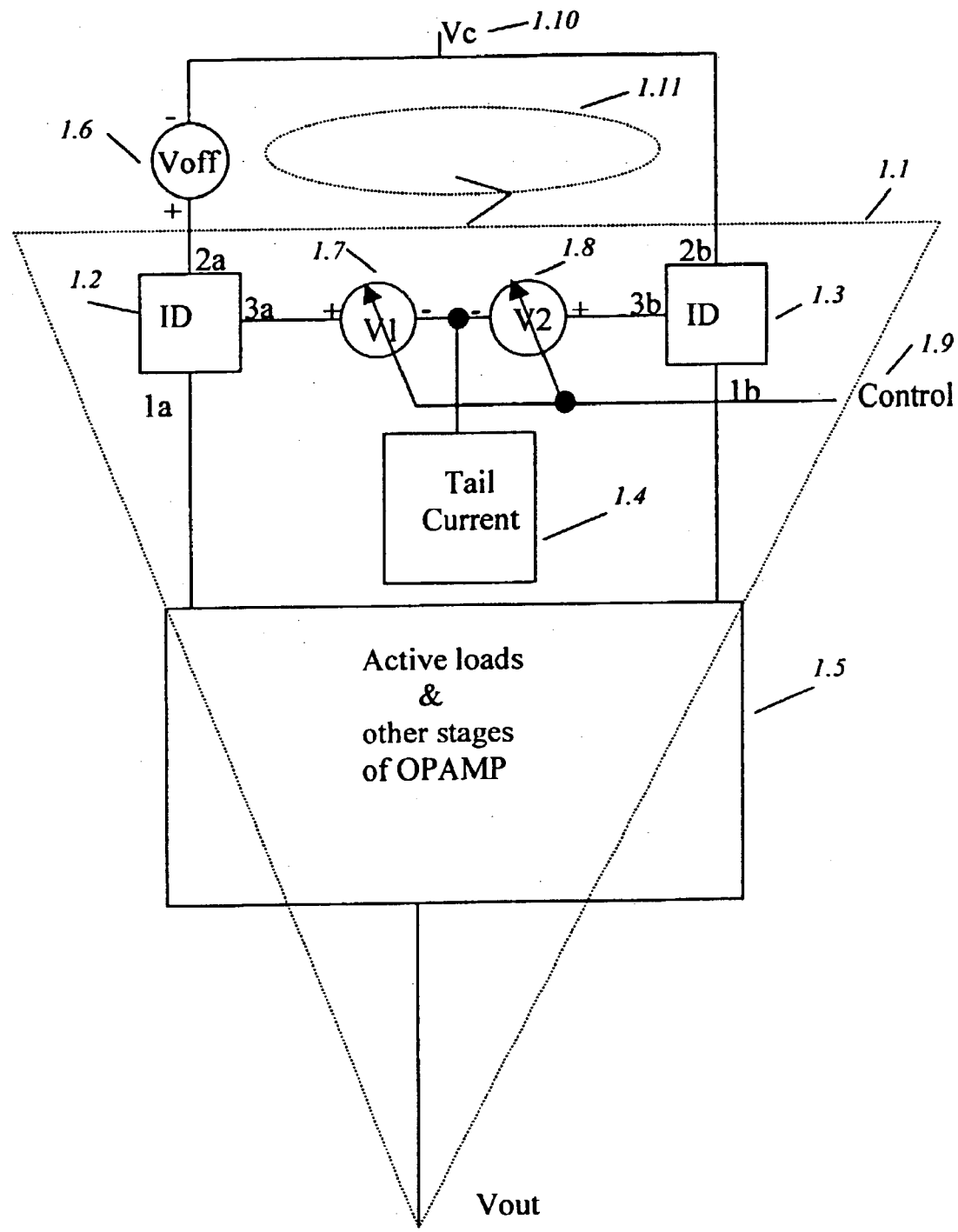
FIG. 1 is a block diagram showing an operational amplifier.

FIG. 1 shows the block diagram of an opamp. Different components of an OPAMP (inside the dashed lines [1.1]) are shown as blocks. The IDs [1.2, 1.3] are the input devices of the differential stage of the OPAMP, which can be N or P type MOS or NPN or PNP bipolar devices. Tail current [1.4], active loads and following stages [1.5] are shown as different boxes. The offset voltage caused by different mismatches and non-idealities, is referred to the input (outside OPAMP) as Voff [1.6], so that the components of the OPAMP are considered to be matched. The offset voltage due to the differential amplifier only is determined by:

$$Voff = \Delta Vt_{diff} + \Delta Vt_{load}\left(\frac{gm_{load}}{gm_{diff}}\right) + \frac{\Delta(Vgs - Vt)diff}{2} \cdot \left[\frac{-\Delta(W/L)_{diff}}{(W/L)_{diff}} - \frac{\Delta(W/L)_{load}}{(W/L)_{load}}\right] \quad (1)$$

To nullify the effect of Voff to an ideal OPAMP, two controllable voltage drops, V1 [1.7] & V2 [1.8], are introduced between terminal 3a and tail current and between 3b and tail current respectively (where 3a & 3b are sources in the case of a MOS input device implementation, and emitters in the case of a bipolar input device implementation). 2a and 2b are the gate (base) and 1a and 1b are the drain (collector) of input MOS (Bipolar) devices. The control [1.9] is such that when V1 increases, V2 decreases and vice versa. When inputs are held at a common mode voltage, Vc [1.10], applying Kirchoff's Voltage Law in the loop (shown by dotted line [1.11] in FIG. 1), results in (with sign conventions as in the same figure):

$$-Voff + V_{2a,3a} + V1 - V2 - V_{2b,3b} = 0 \quad (2)$$

As for matched components (after transferring mismatching effects to Voff), $V_{2a,3a} = V_{2b,3b}$, equation (2) reduces to:

$$Voff = V1 - V2 \quad (3)$$

Thus, it shows that with controlled V1 and V2, the offset voltage caused by non-idealities of the OPAMP components can be cancelled.

The implementation is explained with the help of a two stage PMOS input OPAMP and associated circuitry to achieve the goal. Though, the circuitry is shown with a PMOS input Cmos OPAMP it can be extended to NMOS input or even bipolar NPN or PNP inputs or BiCMOS implementations.

Figure 2:
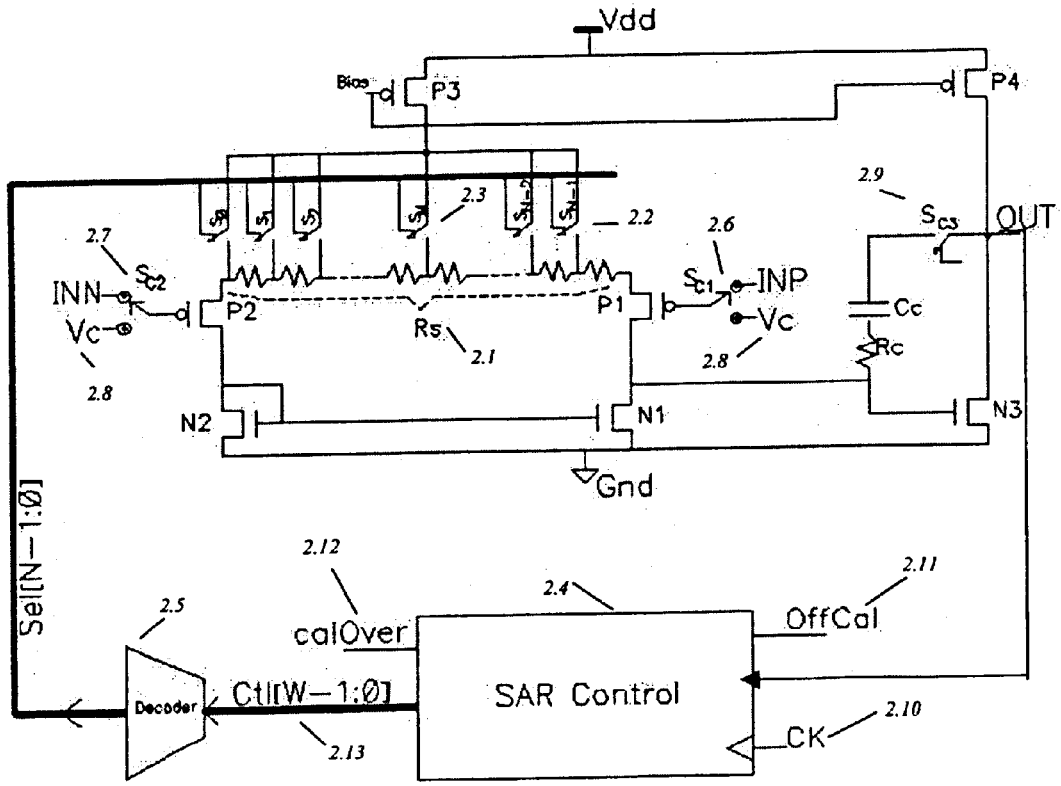
FIG. 2 is a circuit diagram showing an opamp according to this invention.

Referring to FIG. 2, transistors P1–P4, transistors N1–N3, resistor Rc and capacitor Cc form a PMOS input two-stage opamp. A resistor Rs [2.1] with equidistant taps, is connected between the sources of the differential input pair, P1 and P2. The taps are routed to the drain of the tail current supplier MOS P3 by a set of switches $S_0$ to $S_{N-1}$ [2.2]. By default, the mid-tap switch $S_M$ [2.3] is connected. The on-off controls to the switches are fed from a digital control block SAR control [2.4] through a decoder [2.5]. There are other two-way switches $S_{C1}$ [2.6] and $S_{C2}$ [2.7] which toggle between normal opamp inputs (INP, INN) and the fixed common mode voltage Vc [2.8] for the offset calibration cycle. Switch $S_{C3}$ [2.9] opens during the offset calibration cycle to use the opamp in faster comparator mode. The controls to these switches are also provided by the SAR control block. The SAR control block needs a slow clock CK [2.10] which should be slow enough to resolve the effect of the change in resistor's selected tap position by the opamp in comparator mode. The signal, OffCal [2.11], initiates the calibration cycle when set and calOver [2.12] shows the status indicating whether the calibration is over. The same circuit can be realized using NMOS, NPN or PNP input counterparts of the opamp.

Figure 3:
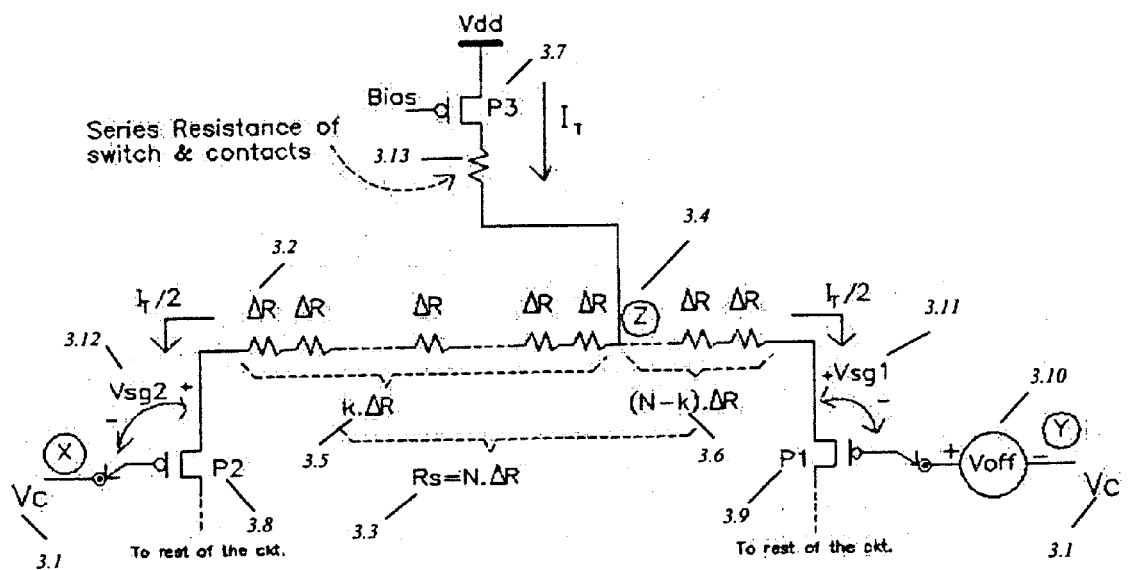
FIG. 3 is a partial circuit diagram illustrating The circuit analysis of the opamp of FIG. 2.

FIG. 3 explains the offset cancellation technique. The input differential PMOS transistors having inputs connected to Vc [3.1], as in the calibration mode, are shown. ΔR [3.2] is the resistance of each segment of the resistor, Rs [3.3], where Rs=N·ΔR. When the resistor tap at location Z [3.4] is selected, k·ΔR [3.5] and (N−k)·ΔR [3.6] are the resistances between the tail current ($I_T$, provided by P3 [3.7] of FIG. 3) injection point, Z, and sources of P2 [3.8] and P1 [3.9], respectively. Voff [3.10], the input referred offset voltage of the uncalibrated opamp, is represented by a lumped voltage caused by the mismatches of the inputs, active load pair, other current mirrors etc. Under this representation, the rest of the circuit can be assumed to be perfectly matched and for tap position at Z, the Voff is cancelled in the total circuit. Applying Kirchoff's voltage law in the loop Vc@X and Vc@Y:

$$Vc + Vsg_2 + \frac{I_T}{2} \cdot (k \cdot \Delta R) = \frac{I_T}{2} \cdot ((N-k)\Delta R) + Vsg_1 + Voff + Vc \quad (4)$$

As P1 & P2 MOS transistors are considered to be matched after including Voff, Vsg1 [3.11] and Vsg2 [3.12] are the same, therefore, the above equation can be reduced to give:

$$Voff = \frac{I_T}{2} \cdot (2k - N) \cdot \Delta R \quad (5)$$

Now, it is clear from equation (5), that by moving the tap position to the left (k<N/2) or to the right (K>N/2) of the center (k=N/2), the input referred negative or positive offset voltage can be cancelled. Moving each tap position (i.e., replacing k by k+1 or k−1) would cause change in offset voltage by $\pm I_T \cdot \Delta R$. It is also clear that, by moving the tap position, the voltage drop on one side of the tap increases and at the same time in the voltage drop on other side reduces as required by equation (3).

The total input referred offset that can be cancelled by this method is $\epsilon(I_T \cdot N \cdot \Delta R)/2$; the resolution (accuracy) of the offset cancellation is limited by the factor $I_T \cdot \Delta R$. The number of switches and tap points, N, should be as a power of 2 as there are controlled by an encoded digital word with number of bits, W, equals to log2(N). The required digital word, Ctl[W-1:0] [2.13], to cancel the offset voltage, is determined by a calibration phase with any well-known successive approximation method, when the opamp is not in use.

Figure 4:
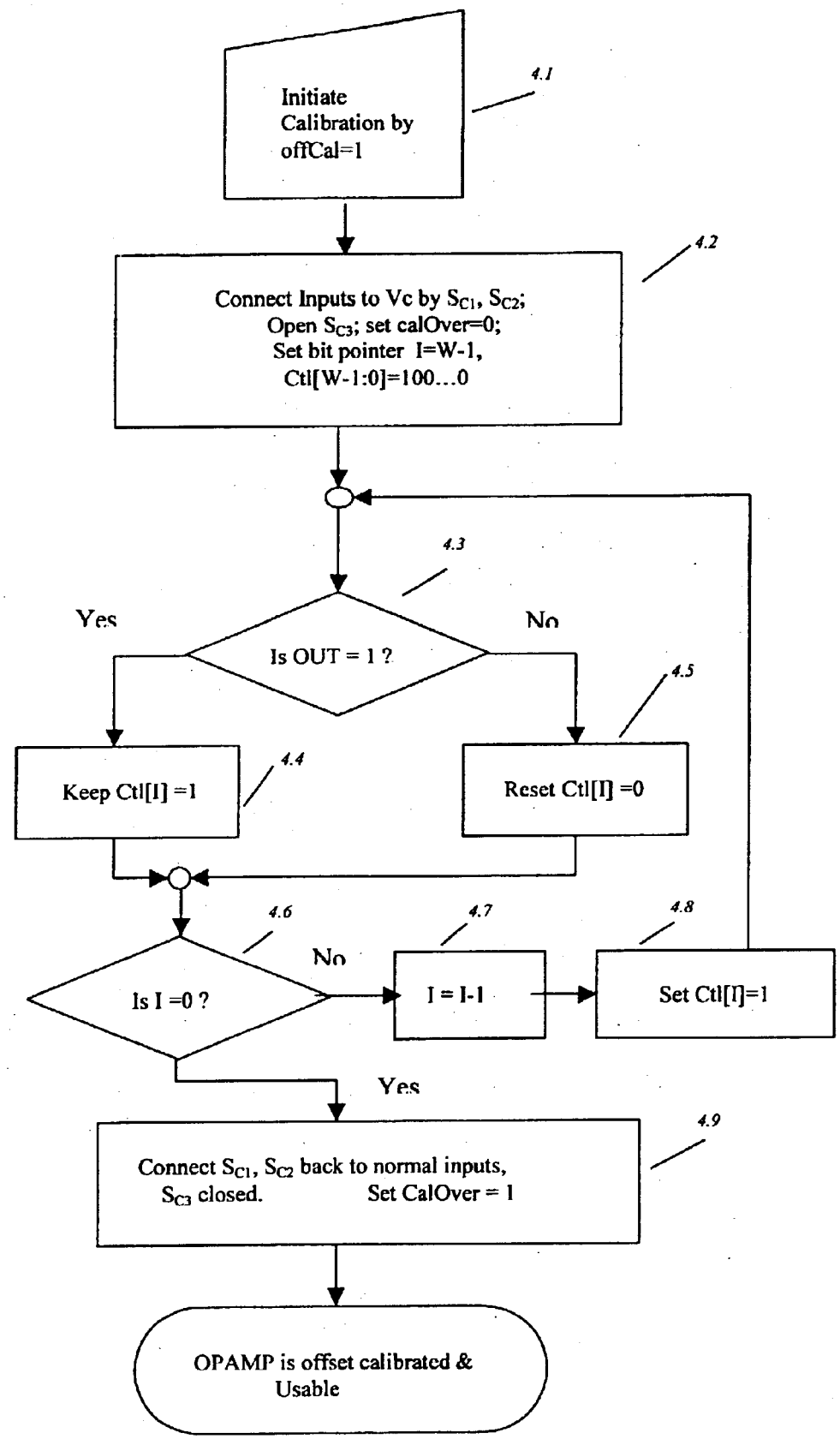
FIG. 4 is a flow chart explaining the offset correction process.

FIG. 4 shows the method of offset calibration, carried out by the SAR control digital block [2.4]. The signal names used in the flowchart are taken from FIG. 2. The offset calibration method uses a well-known successive approximation method. The calibration cycle is initiated by setting offCal[2.11]=1 in step 1 [4.1]. In step 2 [4.2], input two-way switches ($S_{C1}$, $S_{C2}$) [2.6, 2.7] are connected to a common mode voltage, Vc [2.8], and $S_{C3}$ [2.9] opens the compensation circuit to enable the opamp to act as a fast comparator. CalOver [2.12] status bit is set to 0, a bit pointer, I, is set to maximum number of bits in the control word (W-1) and the control word [2.13] is set to 100 . . . 00 so that the center tap of the offset canceling resistor is selected by the switches $S_0$, $S_1$, . . . , $S_{N-1}$ [2.2]. In the next step [4.3], the opamp's (now acting as a comparator) output is checked for its state; if it is '1', the particular control bit pointed by I, the most significant bit ctl[W-1] in this case, is kept as '1' [4.4] otherwise it is reset to '0' [4.5]. Then the bit pointer, I, is checked [4.6] to determine whether it is pointing to the least significant bit; if not, bit pointer is decremented [4.7], next significant bit of the control bit Ctl[I] is set to '1' and steps [4.3] to [4.6] are repeated until the pointer completes the least significant bit. Thus, once each bit of the control word is decided, we get a unique control word, Ctl[W-1:0], which minimizes the offset voltage to the minimum allowable value, $I_T \cdot \Delta R$. Then, in the final step [4.9], the switches, $S_{C1}$, $S_{C2}$, $S_{C3}$ are thrown back to their pre-calibration-phase states, and the OPAMP is usable as an offset compensated amplifier now. The calibration phase described so far, needs to be activated at least once or as needed, when the OPAMP is not in use in the system.

It is important that the variation of the tail current ($I_T$) with the supply voltage and operating temperature range, should be reduced to minimize the undesirable voltage and temperature coefficient of the calibrated offset voltage.

Finally, some points on the resistance (Rs), the resistors-taps contact resistance and the layout fashion followed for Rs are discussed here. The change in offset voltage with the change in selected tap points is monotonic in nature. The resistor, Rs, is made of a single resistor strip with equidistant taps from the side of the strip. This is done to avoid inaccuracies creeping in the calculation of $I_T \cdot \Delta R$ due to finite contact resistances, if separate resistors had been used for each segment. The series resistances of the switches and the unavoidable contact resistance where $I_T$ enters Rs, can be considered lumped in series [3.13] with the $I_T$ before the entry point, Z[3.4], in FIG. 3. Thus, these resistances do not cause any error in the calculation of minimum offset voltage, $I_T \cdot \Delta R$. The side taps of a long resistor strip are quite commonly used in resistive Digital to Analog Converters, so the same structure is used here. The contact resistances on two extreme ends of resistor Rs usually cancel out, as these two resistances can also be considered outside Rs and they are in series with the source of P1 and P2 (these end-point contact resistances are not shown in FIG. 3).

That which is claimed is:

1. A method for reducing offset voltage in an operational amplifier without the need for switched-capacitors, external offset-correction resistors, precise matching between the internal components of the operational amplifier or analog characterization of the fabrication process, said method not resulting in any increase in the static current consumption of the operational amplifier and comprising the steps of:

introducing a tapped resistor chain between the common connected terminals of the transistors of the input differential pair of the operational amplifier and connecting the tail current source/sink of the differential amplifier to a selected tap of the resistor chain, operating periodically or whenever desired, the operational amplifier in a calibration mode when the input terminals of the input differential amplifier are disconnected from the input terminals of the operational amplifier and connected to the same common-mode internal reference voltage point, monitoring the final output voltage and adjusting the selection of the tap in the resister chain to which the tail current source/sink is connected in the input differential amplifier in order to minimize the value of the final offset voltage, and storing the final tap selection and reconnecting the input differential amplifier inputs to the operational amplifier input terminals for resuming normal operation.

2. A method as claimed in claim 1 wherein the calibration mode includes disconnecting the internal phase compensation circuitry, if any, and said operating operational amplifier in open loop mode, as a comparator to provide minimum delay.

3. A method as claimed in claim 1 wherein the selection of said tap in the resistor chain during the calibration mode is automatically performed using any known successive approximation technique.

4. A method as claimed in claim 1 including the use of a single resistor strip with side contacts for said taps, so as to minimize inaccuracies due to finite contact resistances.

5. An improved operational amplifier providing reduced offset voltage without the need for switched-capacitor circuitry, external offset adjustment resistors, tightly matched internal components, or a fabrication process characterized for analog parameter, said improved operational amplifier not consuming any additional static current, and comprising:

an input differential amplifier incorporating a tapped resistor chain connected between the common-connected terminals of the transistors of the input differential amplifier with the current source/sink output connected to a selected one of said taps, mechanism for operating said operational amplifier in a calibration mode either periodically or whenever desired, means for disconnecting the inputs of said input differential amplifier from the inputs of said operational amplifier, and connecting them to the same common-mode internal reference voltage, during said calibration mode, means for monitoring the output voltage and adjusting the selection of said tap in said resistor chain such that the offset voltage is minimized, and mechanism for storing the selection of said resistor tap and reconnecting the inputs of said input differential amplifier to the input terminals of said operational amplifier, for resuming normal operation.

6. An improved operational amplifier as claimed in claim 5 wherein means for disconnecting phase compensation circuitry, if any, and operating said operational amplifier as a comparator during the calibration mode are provided, so as to minimize delay.

7. An improved operational amplifier as claimed in claim 5 wherein said mechanism for automatically determining tap selection in the resistor chain is any known successive approximation technique.

8. An improved operational amplifier as claimed in claim 5 wherein said tapped resistor chain is made using a single resistor strip with side taps, so as to minimize inaccuracies due to finite contact resistances.

* * * * *

UNITED STATES PATENT AND TRADEMARK OFFICE
CERTIFICATE OF CORRECTION

PATENT NO.      : 6,859,095 B2
DATED           : February 22, 2005
INVENTOR(S)     : Nandy et al.

It is certified that error appears in the above-identified patent and that said Letters Patent is hereby corrected as shown below:

Column 6, line 15 - Column 8, line 12,
Delete claims 1-16, and substitute therefor claims 1-16, as shown below.

1. (currently amended) A method for reducing offset voltage in an operational amplifier without an increase in a static current consumption of the operational amplifier, the operational amplifier comprising an input differential amplifier including a pair of transistors, the method comprising:

introducing a tapped resistor chain between common connected terminals of the pair of transistors of the input differential amplifier and connecting a tail current source/sink of the input differential amplifier to a selected tap of the tapped resistor chain;

operating the operational amplifier in a calibration mode when the input terminals of the input differential amplifier are disconnected from input terminals of the operational amplifier and connected to a common-mode internal reference voltage;

monitoring a final output voltage and adjusting the selection of the tap in the tapped resister chain to which the tail current source/sink is connected in the input differential amplifier to minimize the value of the final offset voltage; and storing a final tap selection and reconnecting the input differential amplifier inputs to the operational amplifier input terminals to resume normal operation.

2. (currently amended) A method as claimed in claim 1 wherein the calibration mode includes disconnecting internal phase compensation circuitry, and operating said operational amplifier in open loop mode, as a comparator to provide minimum delay.

3. (currently amended) A method as claimed in claim 1 wherein the selection of said tap in the tapped resistor chain during the calibration mode is automatically performed using a successive approximation technique.

4. (currently amended) A method as claimed in claim 1 wherein said tapped resistor chain comprises a resistor strip with side contacts for said taps, to minimize inaccuracies due to finite contact resistances.

UNITED STATES PATENT AND TRADEMARK OFFICE
CERTIFICATE OF CORRECTION

PATENT NO. : 6,859,095 B2
DATED : February 22, 2005
INVENTOR(S) : Nandy et al.

It is certified that error appears in the above-identified patent and that said Letters Patent is hereby corrected as shown below:

5. (currently amended) An operational amplifier providing reduced offset voltage without additional static current, and comprising:
        an input differential amplifier including a tapped resistor chain connected between common-connected terminals of the transistors of the input differential amplifier with a current source/sink output connected to a selected tap;
        a calibration unit for operating said operational amplifier in a calibration mode;
        means for disconnecting inputs of said input differential amplifier from inputs of said operational amplifier, and connecting the inputs of said input differential amplifier to a common-mode internal reference voltage, during said calibration mode;
        means for monitoring the output voltage and adjusting the selection of said tap in said tapped resistor chain such that the offset voltage is minimized; and
        a switching circuit for storing the selection of said resistor tap and reconnecting the inputs of said input differential amplifier to the input terminals of said operational amplifier, for resuming normal operation.

6. (currently amended) An operational amplifier as claimed in claim 5 further comprising means for disconnecting phase compensation circuitry and operating said operational amplifier as a comparator during the calibration mode to minimize delay.

7. (currently amended) An operational amplifier as claimed in claim 5 wherein said means for adjusting the selection of said tap uses a successive approximation technique.

8. (currently amended) An operational amplifier as claimed in claim 5 wherein said tapped resistor chain comprises a resistor strip with side taps to minimize inaccuracies due to finite contact resistances.

UNITED STATES PATENT AND TRADEMARK OFFICE
CERTIFICATE OF CORRECTION

PATENT NO. : 6,859,095 B2
DATED : February 22, 2005
INVENTOR(S) : Nandy et al.

It is certified that error appears in the above-identified patent and that said Letters Patent is hereby corrected as shown below:

9. (new) A method for reducing offset voltage in an operational amplifier without increasing static current consumption of the operational amplifier, the operational amplifier comprising an input differential amplifier including a pair of transistors, the method comprising:
providing a tapped resistor chain between the pair of transistors of the input differential amplifier and connecting a tail current source of the input differential amplifier to a selected tap of the tapped resistor chain;
operating the operational amplifier in a calibration mode by disconnecting input terminals of the input differential amplifier from input terminals of the operational amplifier, and connecting the input terminals of the input differential amplifier to a common-mode internal reference voltage;
monitoring an output voltage and adjusting a selection of the tap in the tapped resister chain to minimize an offset voltage; and
reconnecting the input differential amplifier inputs to the operational amplifier input terminals to resume a non-calibration mode.

10. (new) A method as claimed in claim 9 wherein the calibration mode includes disconnecting internal phase compensation circuitry, and operating said operational amplifier in open loop mode as a comparator to minimize delay.

11. (new) A method as claimed in claim 9 wherein the tap is selected during the calibration mode using successive approximation.

12. (new) A method as claimed in claim 9 wherein said tapped resistor chain comprises a resistor strip with side contact taps minimizing inaccuracies due to finite contact resistances.

UNITED STATES PATENT AND TRADEMARK OFFICE
CERTIFICATE OF CORRECTION

PATENT NO. : 6,859,095 B2
DATED : February 22, 2005
INVENTOR(S) : Nandy et al.

It is certified that error appears in the above-identified patent and that said Letters Patent is hereby corrected as shown below:

13. (new) An operational amplifier comprising:
an input differential amplifier including a tapped resistor chain connected between a pair of transistors, and a current source output connected to a selected tap;
a calibration unit to operate said operational amplifier in a calibration mode;
a switching circuit for disconnecting inputs of said input differential amplifier from inputs of said operational amplifier, and connecting inputs of said input differential amplifier to a common-mode internal reference voltage, during said calibration mode; and
a monitoring circuit to monitor an output voltage and adjust selection of said tap to minimize an offset voltage;
the switching circuit reconnecting inputs of said input differential amplifier to the input terminals of said operational amplifier to resume a non-calibration mode.

14. (new) An operational amplifier as claimed in claim 13 further comprising a control circuit to disconnect phase compensation circuitry and operating said operational amplifier as a comparator during the calibration mode to minimize delay.

15. (new) An operational amplifier as claimed in claim 13 wherein said monitoring circuit adjusts selection of said tap using successive approximation.

16. (new) An operational amplifier as claimed in claim 13 wherein said tapped resistor chain comprises a resistor strip with side taps to minimize inaccuracies due to finite contact resistances.

Signed and Sealed this

Twenty-sixth Day of July, 2005

JON W. DUDAS
*Director of the United States Patent and Trademark Office*